(12) United States Patent
Takano

(10) Patent No.: US 6,975,530 B2
(45) Date of Patent: Dec. 13, 2005

(54) MEMORY DEVICE COMPRISING HYSTERETIC CAPACITANCE MEANS

(75) Inventor: Yoh Takano, Ogaki (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/721,252

(22) Filed: Nov. 26, 2003

(65) Prior Publication Data

US 2004/0105297 A1 Jun. 3, 2004

(30) Foreign Application Priority Data

Nov. 28, 2002 (JP) .................................. 2002-345580

(51) Int. Cl.[7] .............................................. G11C 11/22
(52) U.S. Cl. .................... 365/145; 365/149; 365/189.07
(58) Field of Search ................................ 365/149, 145, 365/150, 189.07

(56) References Cited

U.S. PATENT DOCUMENTS 5,086,412 A * 2/1992 Jaffe et al. .................. 365/145
6,788,563 B2 * 9/2004 Thompson et al. ......... 365/145

FOREIGN PATENT DOCUMENTS

JP 02-154388 6/1990

OTHER PUBLICATIONS

Junichi Yamada, Tohru Miwa, Hiroki Koike, and Hideo Toyoshima, A Self–Reference Read Scheme for a 1T/1C FeRAM, 1998 IEEE.
"Ferroelectric Thin Film Memory," Seventh Section "Liability and Assessment Technology of Ferroelectric Memory," I. Switching Fatigue Characteristic, Jun. 30, 1994.
Second Section, MRAM, "Now in production and coming in 2004, 256 M bit," Nikkei Electronics, Feb. 12, 2001 (No. 789), pp. 164–171.

* cited by examiner

Primary Examiner—Tan T. Nguyen
(74) Attorney, Agent, or Firm—Arent Fox, PLLC

(57) ABSTRACT

A memory device capable of suppressing reduction of a read margin resulting from fluctuation of a reference potential while reducing the area of a memory cell array is obtained. This memory device comprises hysteretic capacitance device and a read circuit applying a bias voltage to the capacitance means in different directions in a first time and a second time of data reading respectively for defining read data by comparing first read data and second read data with each other.

16 Claims, 4 Drawing Sheets

| INITIAL DATA | FIRST VARIATION | DATA FOLLOWING FIRST READING | SECOND VARIATION | DATA FOLLOWING SECOND READING | VARIATION CORRESPONDING TO TWO READ OPERATIONS |
|---|---|---|---|---|---|
| 0 | $\Delta V_a$ | 0 | $-\Delta V_b$ | 1 | $\Delta V_a - \Delta V_b < 0$ |
| 1 | $\Delta V_b$ | 0 | $-\Delta V_b$ | 1 | $\Delta V_b - \Delta V_b = 0$ |

MEMORY DEVICE COMPRISING HYSTERETIC CAPACITANCE MEANS

BACKGROUND OF THE INVENTION

1. Field of the Invention

The present invention relates to a memory device, and more particularly, it relates to a memory device comprising hysteretic capacitance means.

2. Description of the Background Art

A ferroelectric memory has recently been known as one of nonvolatile memories comprising hysteretic capacitance means. In relation to such a ferroelectric memory, a simple matrix (cross point) ferroelectric memory having memory cells each constituted of only one ferroelectric capacitor is proposed. This simple matrix (cross point) ferroelectric memory is proposed in Japanese Patent No. 2788265, for example.

FIG. 6 is a schematic diagram for illustrating the structure of a memory cell array of a conventional cross point ferroelectric memory and voltages applied in writing. FIG. 6 is a hysteresis diagram for illustrating the operating principle of the conventional ferroelectric memory shown in FIG. 6.

The conventional cross point ferroelectric memory is now described with reference to FIG. 6. As shown in FIG. 6, each memory cell 101 of the conventional cross point ferroelectric memory is constituted of a word line WL (WL1, WL2 or WL3), a bit line BL (BL1, BL2 or BL3) and a ferroelectric capacitor 102 located on the intersection between the word line WL and the bit line BL. The ferroelectric capacitor 102 has an end connected to the word line WL and another end connected to the bit line BL. In such a cross point ferroelectric memory, the memory cells 101 constituted of only the ferroelectric capacitors 102 with no selector transistors can be highly densified.

Operations of the conventional cross point ferroelectric memory are now described with reference to FIGS. 6 and 7. In a write operation, both ends of each ferroelectric capacitor 102 are at the same potential in a standby state. In order to write data "0" in the selected memory cell 101 connected with the word line WL2 and the bit line BL2, a voltage Vcc and a voltage of 0 V are applied to the word line WL2 and the bit line BL2 respectively, as shown in FIG. 6. Thus, the voltage Vcc is applied to the ferroelectric capacitor 102 of the selected memory cell 101. Therefore, a transition is made to a point A shown in FIG. 7 regardless of the initial state. When both ends of the ferroelectric capacitor 102 are thereafter set to the same potential, a transition is made to "0" shown in FIG. 7. In order to write data "1" in the selected memory cell 101 connected with the word line WL2 and the bit line BL2, the voltage of 0 V and the voltage Vcc are applied to the word line WL2 and the bit line BL2 respectively, as shown in FIG. 6. Thus, a voltage –Vcc is applied to the ferroelectric capacitor 102. Therefore, a transition is made to a point B shown in FIG. 7. When both ends of the ferroelectric capacitor 102 are thereafter set to the same potential, a transition is made to "1" shown in FIG. 7.

In a read operation, the bit line BL2 is precharged to 0 V. Then, the word line WL2 is risen to the voltage Vcc. Assuming that CFE represents the capacitance of the ferroelectric capacitor 102 and CBL represents the parasitic capacitance of the bit line BL, this voltage Vcc is capacitively divided by the capacitance CFE and the parasitic capacitance CBL. As shown in FIG. 7, the capacitance CFE of the ferroelectric capacitor 102 can be approximated as C0 or C1 depending on the data held therein. Therefore, the potential V0 or V1 of the bit line BL is shown by the following expression (1) or (2):

$$V0 = \{C0/(C0+CBL)\} \times Vcc \qquad (1)$$

$$V1 = \{C1/(C1+CBL)\} \times Vcc \qquad (2)$$

The expression (1) shows the potential V0 of the bit line BL in the case of holding the data "0", and the expression (2) shows the potential V1 of the bit line BL in the case of holding the data "1".

A read amplifier determines the difference between the bit line potentials V0 and V1 shown in the above expressions (1) and (2) respectively, thereby reading the data. In other words, the ferroelectric memory is provided with a reference bit line and a reference cell connected thereto for setting a reference potential Vref to an intermediate level (Vref=(V0+V1)/2) between the potential V0 of the bit line BL in the case of holding the data "0" and the potential V1 of the bit line BL in the case of holding the data "1" with the reference cell. The ferroelectric memory compares the reference potential Vref with the potential of the selected bit line BL through a comparator, thereby defining the data.

The conventional ferroelectric memory applies potentials $\frac{1}{3}$Vcc and $\frac{2}{3}$Vcc to non-selected word lines WL and non-selected bit lines BL respectively so that only the potential $\frac{1}{3}$Vcc is applied to non-selected memory cells 101 at the maximum. Thus, the conventional ferroelectric memory minimizes the so-called disturbance reducing the quantity of polarization of the non-selected memory cells 101 leading to disappearance of data.

In data reading of the conventional ferroelectric memory, the data stored in the memory cell 101 is destroyed. Therefore, the conventional ferroelectric memory performs a write operation (restoration) responsive to the read data after the data reading.

In the aforementioned conventional cross point ferroelectric memory, the capacitance CFE of each non-selected memory cell 101 sharing the bit line BL is introduced into the parasitic capacitance CBL due to the presence of no selector transistor, to increase the parasitic capacitance CBL of the bit line BL. Thus, the potential V0 of the bit line BL in the case of holding the data "0" or the potential V1 of the bit line BL in the case of holding the data "1" is reduced from the above expression (1) or (2), and hence a read margin is disadvantageously reduced as shown in the following expression (3) or (4):

$$|Vref-V0| \qquad (3)$$

$$|Vref-V1| \qquad (4)$$

Further, the potential V0 or V1 deviates from a design value due to dispersion in fabrication of the ferroelectric capacitor 102 or a variation of a polarization charge quantity resulting from fatigue caused by repetitive read and write operations, and hence the reference potential Vref also deviates from a design value. Therefore, the read margin is disadvantageously reduced. When the potentials V0(sel) and V1(sel) of the bit line BL connected with the selected memory cell 101 are equal to 2 V and 1 V respectively, for example, an ideal reference potential Vref (ideal) is expressed as follows:

$$Vref(ideal) = (V0+V1)/2 = 1.5 \ V \qquad (5)$$

In this case, the read margin is expressed as follows:

2 $V$–1.5 $V$=0.5 $V$ 1.5 $V$–1.0 $V$=0.5 $V$

When the bit line potentials V0(ref) and V1(ref) of the reference cell are equal to 1.8 V and 0.8 V respectively due to dispersion in fabrication of the ferroelectric capacitor 102 or fatigue, on the other hand, the reference potential Vref is expressed as follows:

$V$ref=(1.8+0.8)/2=1.3 $V$

When the data is read from the aforementioned memory cell 101 with this reference potential Vref, therefore, the read margin is expressed as follows:

2 $V$–1.3 $V$=0.7 $V$ 1.3 $V$–1.0 $V$=0.3 $V$

In other words, the read margin is reduced to 0.3 V.

When the read margin is reduced in the aforementioned manner, the possibility for false reading is disadvantageously increased.

Further, the conventional ferroelectric memory generates the reference potential Vref with the reference cell, and hence the area of the memory cell array is disadvantageously increased.

SUMMARY OF THE INVENTION

An object of the present invention is to provide a memory device capable of suppressing reduction of a read margin resulting from fluctuation of a reference potential while reducing the area of a memory cell array.

A memory device according to an aspect of the present invention comprises hysteretic capacitance means and a read circuit applying a bias voltage to the capacitance means in different directions in a first time and a second time of data reading respectively for defining read data by comparing first read data and second read data with each other.

The memory device according to this aspect, provided with the read circuit applying the bias voltage to the capacitance means in different directions in the first time and the second time of the data reading respectively for defining the read data by comparing the first read data and the second read data with each other as hereinabove described, can read the data without employing a reference cell for generating a reference potential of an intermediate level between a bit line potential for data "0" and a bit line potential for data "1" dissimilarly to the prior art. Thus, no reference potential fluctuates due to a variation of a polarization charge quantity resulting from dispersion in fabrication of a reference cell or fatigue caused by repetitive read and write operations, whereby reduction of the read margin resulting from fluctuation of a reference voltage can be suppressed. Consequently, false data reading can be suppressed. Further, no reference cell may be provided and hence the area of a memory cell array can be reduced.

In the memory device according to the aforementioned aspect, the read circuit preferably defines the read data on the basis of a variation of the potential of a bit line corresponding to the first read data and a variation of the potential of a bit line corresponding to the second read data. According to this structure, the difference between the variation of the potential of the bit line corresponding to the first read data and the variation of the potential of the bit line corresponding to the second read data varies with whether the data is "0" or "1", whereby the read circuit can easily define the read data.

In this case, the read circuit preferably includes a first circuit part detecting the variation of the potential of the bit line corresponding to the first read data and a second circuit part detecting the variation of the potential of the bit line corresponding to the second read data. According to this structure, the read circuit can easily detect the variations of the potentials of the bit lines corresponding to the first and second read data with the first and second circuit parts respectively.

In this case, further, the first circuit part preferably includes a first transistor connected to the bit line for entering an ON state in the first time of the data reading and entering an OFF state in the second time of the data reading, and the second circuit part preferably includes a second transistor connected to the bit line for entering an ON state in the second time of the data reading and entering an OFF state in the first time of the data reading. According to this structure, the read circuit can easily detect the variations of the potentials of the bit lines corresponding to the first and second read data independently of each other by turning on/off the first and second transistors respectively.

In the memory device according to the aforementioned aspect, the read circuit preferably includes a resistance dividing circuit for generating a reference potential consisting of a first potential. According to this structure, the read circuit can generate a non-fluctuating reference potential by resistance division.

In this case, the read circuit preferably defines the read data on the basis of the difference between a variation of the potential of a bit line corresponding to the first read data and a variation of the potential of a bit line corresponding to the second read data and the reference potential consisting of the first potential generated by the resistance dividing circuit. According to this structure, the read circuit can define the read data with the non-fluctuating reference potential, thereby suppressing reduction of the read margin resulting from fluctuation of the reference voltage. Consequently, the memory device can suppress false data reading.

In this case, the read circuit preferably includes a comparator comparing the difference between the variation of the potential of the bit line corresponding to the first read data and the variation of the potential of the bit line corresponding to the second read data and the reference potential generated by the resistance dividing circuit with each other. According to this structure, the read circuit can easily define the read data with the comparator.

In this case, further, the comparator preferably includes a first input terminal supplied with the reference potential and a second input terminal connected with a node, the resistance dividing circuit preferably also generates a second potential in addition to the reference potential consisting of the first potential, and the second potential is preferably applied to the node connected with the second input terminal of the comparator as an initial potential. According to this structure, the read circuit can easily define the read data by comparing a potential obtained by adding the variation of the potential of the bit line to the non-fluctuating initial potential generated by resistance division and the non-fluctuating reference potential generated by resistance division with each other through the comparator.

In the memory device including the aforementioned resistance dividing circuit generating the second potential, the read circuit preferably includes a third transistor connected between a portion of the resistance dividing circuit generating the second potential and the node connected with the second input terminal of the comparator for entering an ON state in an initial state and entering an OFF state in the data reading. According to this structure, the node connected to the second input terminal of the comparator can be easily brought into a floating state in the data reading, whereby the potential of the node can be easily changed by a level corresponding to the variation of the potential of the bit line.

In the memory device including the aforementioned resistance dividing circuit generating the second potential, the reference potential is preferably set to an intermediate level between a potential obtained by adding the difference between the variation of the potential of the bit line corresponding to the first read data and the variation of the potential of the bit line corresponding to the second read data with reference to initial data formed by first data to the initial potential of the node and a potential obtained by adding the difference between the variation of the potential of the bit line corresponding to the first read data and the variation of the potential of the bit line corresponding to the second read data with reference to initial data formed by second data to the initial potential of the node. According to this structure, the read circuit can easily define the read data by determining whether the potential of the node is greater or less than the reference potential with the comparator.

In the memory device according to the aforementioned aspect, a first bias voltage and a second bias voltage applied to the capacitance means in the data reading are preferably voltages, reversed in polarity to each other, having substantially equal absolute values. According to this structure, the memory device may simply detect whether or not variations of two read potentials are zero or negative (positive), thereby easily reading the data.

In the memory device according to the aforementioned aspect, the hysteresis curve of the capacitance means is preferably substantially symmetrical with respect to the origin. According to this structure, the memory deice can easily set the variations of the two read potentials to zero or negative (positive).

In the memory device according to the aforementioned aspect, the hysteretic capacitance means preferably includes a ferroelectric capacitor. According to this structure, it is possible to obtain a ferroelectric memory suppressing reduction of a read margin.

In the memory device including the aforementioned ferroelectric capacitor, the ferroelectric capacitor preferably consists of a bit line, a word line and a ferroelectric film arranged between the bit line and the word line, and the memory device may further comprise memory cells each consisting of such a ferroelectric capacitor.

In this case, a voltage n/m times the bias voltage, where m>n, is applied to memory cells other than a selected memory cell in the data reading. According to this structure, it is possible to suppress disturbance causing disappearance of data resulting from polarization deterioration in the memory cells other than the selected one.

The memory device including the aforementioned ferroelectric capacitor may further comprise memory cells each consisting of a single ferroelectric capacitor and a single transistor connected to the ferroelectric capacitor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
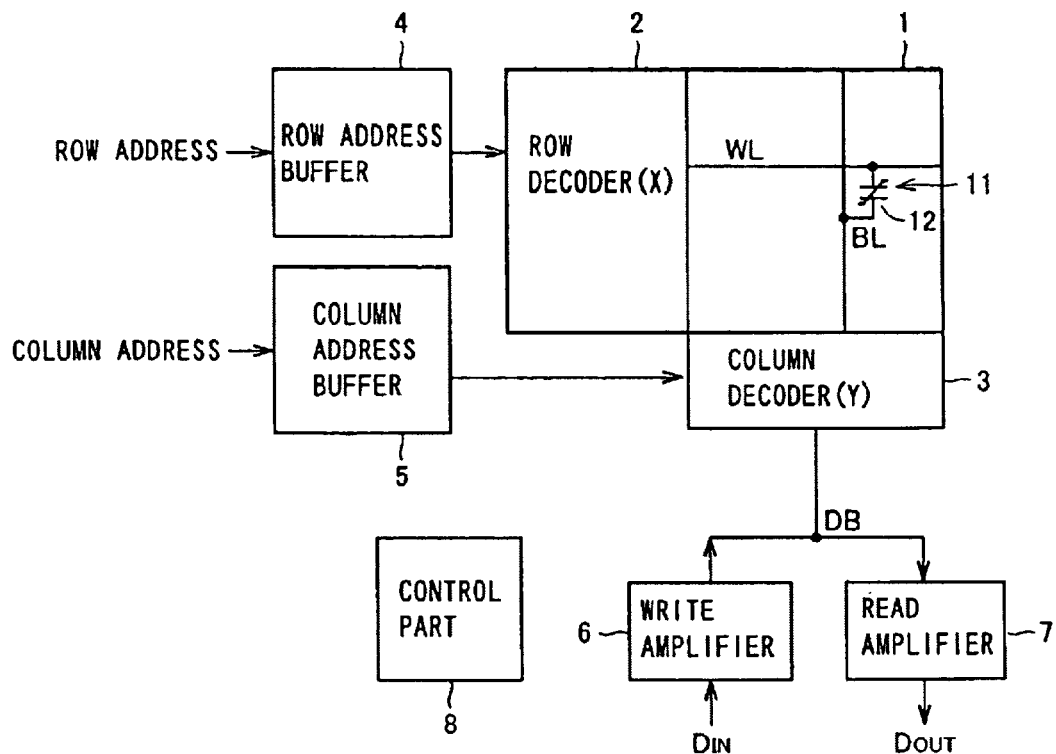
FIG. 1 is a block diagram showing the overall structure of a ferroelectric memory according to a first embodiment of the present invention.
Figure 2:
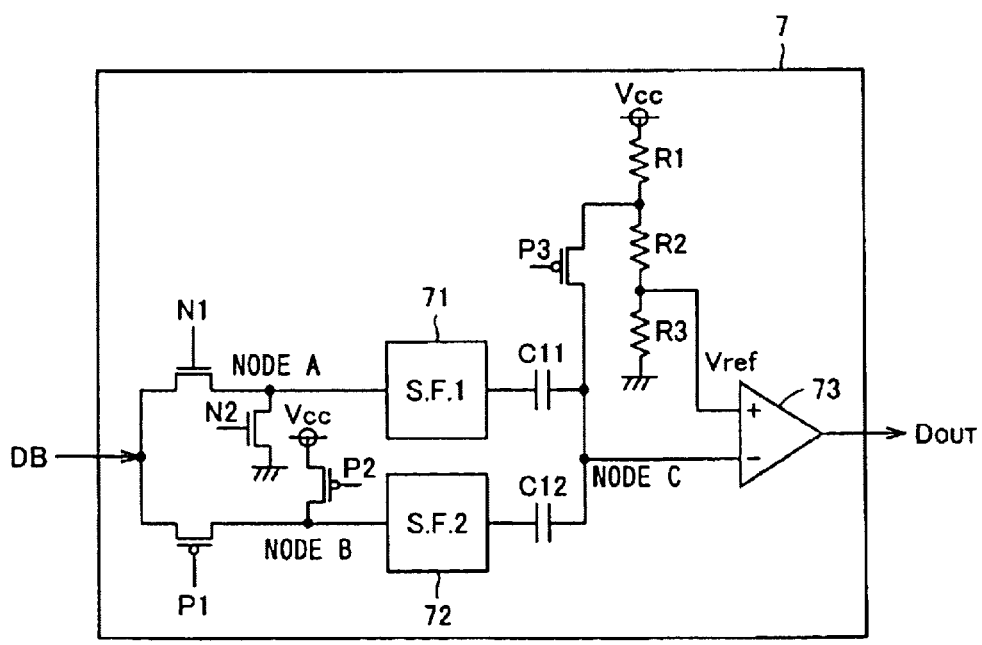
FIG. 2 is a circuit diagram showing the internal structure of a read amplifier of the ferroelectric memory according to the first embodiment shown in FIG. 1.

FIG. 1 is a block diagram showing the overall structure of a cross point ferroelectric memory according to a first embodiment of the present invention. FIG. 2 is a circuit diagram showing the internal structure of a read amplifier 7 of the ferroelectric memory according to the first embodiment shown in FIG. 1.

The overall structure of the cross point ferroelectric memory according to the first embodiment is described with reference to FIG. 1. The ferroelectric memory according to the first embodiment comprises a memory cell array 1, a row decoder 2, a column decoder 3, a row address buffer 4, a column address buffer 5, a write amplifier 6, the read amplifier 7 and a control part 8. The read amplifier 7 is an example of the "read circuit" in the present invention.

As shown in FIG. 1, the memory cell array 1 includes a plurality of cross point (simple matrix) memory cells 11 each consisting of only a ferroelectric capacitor 12. This ferroelectric capacitor 12 consists of a bit line BL, a word line WL and a ferroelectric film (not shown) arranged between the bit line BL and the word line WL. The ferroelectric capacitor 12 is an example of the "capacitance means" in the present invention. The row decoder 2 and the column decoder 3 are connected with the word line WL and the bit line BL of the memory cell array 1 respectively.

As shown in FIG. 2, the read amplifier 7 of the ferroelectric memory according to the first embodiment comprises n-channel transistors N1 and N2, p-channel transistors P1, P2 and P3, coupling capacitors C11 and C12, source followers 71 and 72, resistances R1, R2 and R3 and a comparator 73. The n-channel transistor N1 is connected between a data bus DB and a node A. The n-channel transistor N1 is an example of the "first transistor" in the present invention. The n-channel transistor N2 has a first source/drain connected to the node A and a grounded second source/drain. The source follower 71 is connected between the node A and a first electrode of the coupling capacitor C11. A second electrode of the coupling capacitor C11 is connected to another node C. A circuit part consisting of the n-channel transistors N1 and N2, the source follower 71 and the coupling capacitor C11 is an example of the "first circuit part" in the present invention.

The p-channel transistor P1 is connected between the data bus DB and still another node B. This p-channel transistor P1 is an example of the "second transistor" in the present invention. The p-channel transistor P2 has a first source/drain connected to the node B and a second source/drain connected to a power supply voltage Vcc. The source follower 72 is connected between the node B and a first electrode of the coupling capacitor C12. A second electrode of the coupling capacitor C12 is connected to the node C, which in turn is connected to an inversion input terminal of the comparator 73. A circuit part consisting of the p-channel transistors P1 and P2, the source follower 72 and the coupling capacitor C12 is an example of the "second circuit part" in the present invention.

The resistances R1, R2 and R3 are serially connected between the power supply voltage Vcc and a ground potential. The p-channel transistor P3 has a first source/drain connected to the junction between the resistances R1 and R2 and a second source/drain connected to the node C. This p-channel transistor P3 is an example of the "third transistor" in the present invention. A non-inversion input terminal of the comparator 73 is connected to the junction between the resistances R2 and R3.

According to the first embodiment, the ferroelectric memory generates a reference voltage Vref by resistance-dividing the power supply voltage Vcc with the resistances R1, R2 and R3. The ferroelectric memory applies the reference voltage Vref to the non-inversion input terminal of the comparator 73.

Figures 3, 4:
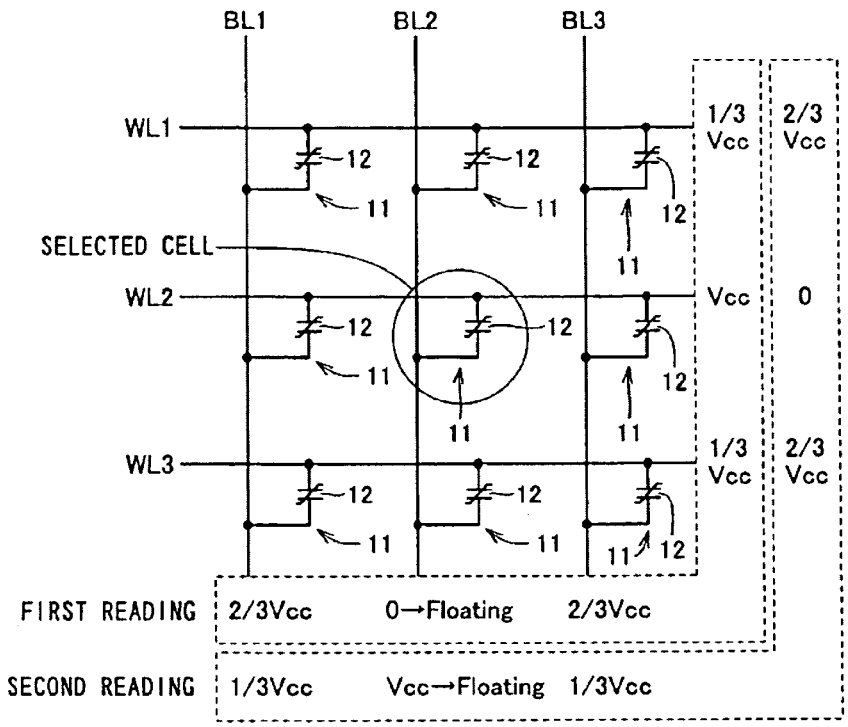
FIG. 3 is a schematic diagram for illustrating the structure of a memory cell array of the ferroelectric memory according to the first embodiment of the present invention and voltages applied in reading.
FIG. 4 illustrates variations of a bit line potential and states of data in a read operation of the ferroelectric memory according to the first embodiment of the present invention.

FIG. 3 is a schematic diagram for illustrating the structure of the memory cell array 1 of the ferroelectric memory according to the first embodiment of the present invention and voltages applied in reading, and FIG. 4 illustrates variations of a bit line potential and states of data in a read operation of the ferroelectric memory according to the first embodiment of the present invention. The read operation of the ferroelectric memory according to the first embodiment is now described with reference to FIGS. 1 to 4.

Figure 7:
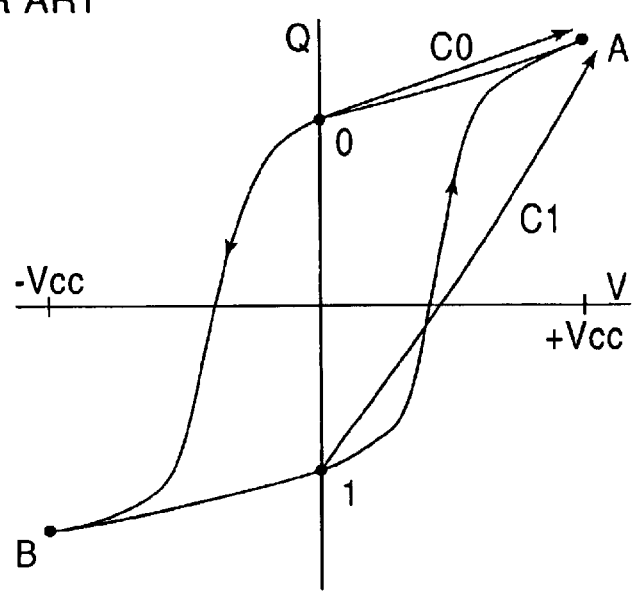
FIG. 7 is a hysteresis diagram for illustrating the operating principle of the conventional ferroelectric memory shown in FIG. 6.

In the read operation, the ferroelectric memory according to the first embodiment sets the potential of the bit line BL to a level V0 or V1 with respect to data "0" or "1" when rising the potential of the word line WL to the power supply voltage Vcc. It is assumed that $\Delta$Va and $\Delta$Vb represent variations of the potentials V0 and V1 of the bit line BL obtained by setting the bit line potential to 0 V, thereafter bringing the same into a floating state and rising the potential of the word line WL to the power supply voltage Vcc respectively. The value C1 is greater than the value C0 as understood from the hysteresis diagram shown in FIG. 7, and hence the potential V1 is greater than the potential V0 as understood from the above expressions (1) and (2). Therefore, the quantity $\Delta$Vb is greater than the quantity $\Delta$Va ($\Delta$Vb>$\Delta$Va).

When the ferroelectric memory performs the read operation while relatively setting the potential of the word line WL to a level -Vcc with respect to the potential of the bit line BL in this case, the bit line BL exhibits a variation -$\Delta$Vb with respect to the data "0" or a variation -$\Delta$Va with respect to the data "1" if the hysteresis curve (refer to FIG. 7) is symmetrical about the origin.

Consider a case of reading data from the word line WL twice under a condition of +Vcc→-Vcc as viewed from the bit line BL in the first embodiment. The read operation is now described in detail.

(Initial State)

Consider a case of reading data from a selected cell 11 located on the intersection between a bit line BL2 and a word line WL2 in the first embodiment. First, the ferroelectric memory connects the selected bit line BL2 to the read amplifier 7 through the column decoder 3. In this state, the n-channel transistors N1 and N2 shown in FIG. 2 are in ON states, and the selected bit line BL2 and the node A are precharged to zero. The p-channel transistor P1 is in an OFF state, and the p-channel transistor P2 is in an ON state. Thus, the node B is precharged to the power supply voltage Vcc. The p-channel transistor P3 is in an ON state, and the node C is precharged to a voltage Vini decided by resistance division of the resistances R1, R2 and R3.

(First Read Operation)

The n-channel transistor N2 is turned off, thereby bringing the selected bit line BL2 and the node A into floating states (high impedance states) at a low level. The p-channel transistor P3 is turned off, thereby bringing the node C into a floating state (high impedance state) at the voltage Vini. When the selected word line WL2 rises to the power supply voltage +Vcc in this state, a first potential variation ($\Delta$Va or $\Delta$Vb) shown in FIG. 4 appears as the potential variation of the selected bit line BL2. This potential variation $\Delta$Va or $\Delta$Vb of the selected bit line BL2 is transmitted to the node C through the source follower 71 and the coupling capacitor C11. Assuming that the capacitances of the coupling capacitors C11 and C12 are equal to each other (C11=C12), a variation half the variation ($\Delta$Va or $\Delta$Vb) of the potential of the bit line BL2 appears on the node C.

When data "0" is written in the selected cell 11, the potential of the node C is expressed as follows:

$$Vini+\Delta Va/2$$

When data "1" is written in the selected cell 11, the potential of the node C is expressed as follows:

$$Vini+\Delta Vb/2$$

Thereafter the ferroelectric memory turns off the n-channel transistor N1, thereby separating the selected bit line BL2 from the node A.

(Second Read Operation)

The word line WL2 and the bit line BL2 are precharged to a high level (the level of the power supply voltage Vcc). The bit line BL2 enters a floating state (high impedance state). Thereafter the p-channel transistor P1 enters an ON state and the p-channel transistor P2 enters an OFF state, thereby connecting the bit line BL2 and the node B with each other. Thus, the selected bit line BL2 enters a floating state at the level of the power supply voltage Vcc. Then, the word line WL2 falls to 0 V, thereby bringing the potential thereof to the level -Vcc as viewed from the bit line BL2. Thus, a second potential variation (-$\Delta$Vb) shown in FIG. 4 appears on the bit line BL2. This potential variation -$\Delta$Vb of the bit line BL2 is transmitted to the node C through the source follower 72 and the coupling capacitor C12. Assuming that the capacitances of the coupling capacitors C12 and C11 are equal to each other, a variation half the potential variation (-$\Delta$Vb) of the bit line BL2 appears on the node C.

The potential of the node C is expressed in the following equation (6) when the data "0" is originally written in the selected cell 11, or expressed in the following equation (7) when the data "1" is originally written in the selected cell 11:

$$Vini+\Delta Va/2-\Delta Vb/2=Vaa<Vini \quad (6)$$

$$Vini+\Delta Vb/2-\Delta Vb/2=Vini \quad (7)$$

According to the first embodiment, the ferroelectric memory generates the reference potential Vref (Vaa<Vref<Vini) from the above equations (6) and (7) by resistance division as shown in FIG. 2. The ferroelectric memory compares the reference potential Vref and the potential of the node C with each other through the comparator 73, thereby defining the data.

In the first reading and the second reading described above, the ferroelectric memory applies potentials shown in FIG. 3 to non-selected bit lines BL1 and BL3 and non-selected word lines WL1 and WL3.

The data in the memory cell 11 is destroyed in data reading. Therefore, the ferroelectric memory performs rewriting (restoration) responsive to the read data after the data reading.

The ferroelectric memory according to the first embodiment can perform data reading with no reference cell for generating a reference potential at an intermediate level between bit line potentials for data "0" and "1" dissimilarly to the prior art by applying bias potentials |Vcc| reversed in polarity to each other with equal absolute values to the ferroelectric capacitor 12 in the data reading as hereinabove described. Thus, no fluctuation of the reference potential Vref results from dispersion in fabrication of the reference cell or fatigue caused by repetitive read and write operations, whereby the ferroelectric memory can suppress reduction of a read margin resulting from fluctuation of the reference potential Vref. Consequently, the ferroelectric memory can suppress false data reading. According to the first embodiment, further, the ferroelectric memory may be provided with no reference cell, and hence the area of the memory cell array 1 can be reduced.

According to the first embodiment, in addition, the ferroelectric memory can generate the non-fluctuating reference potential Vref by resistance division of the resistances R1, R2 and R3, dissimilarly to the prior art employing a reference cell.

According to the first embodiment, in addition, the ferroelectric memory also forms the initial potential Vini of the node C by resistance division of the resistances R1, R2 and R3, whereby the potential Vini is also non-fluctuating. Thus, the ferroelectric memory can improve reading precision when performing the read operation by comparing the potential Vini and the reference potential Vref with each other. Consequently, the ferroelectric memory can further suppress false data reading.

(Second Embodiment)

Figure 5:
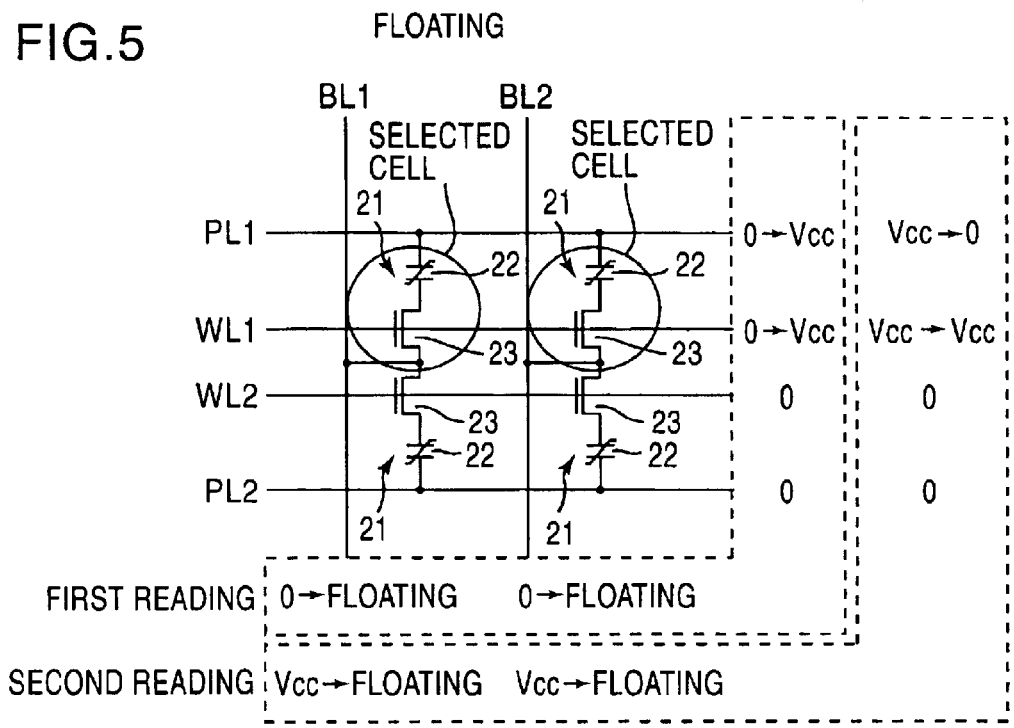
FIG. 5 is a schematic diagram for illustrating the structure of a memory cell array of a ferroelectric memory according to a second embodiment of the present invention and voltages applied in reading.
Figure 6:
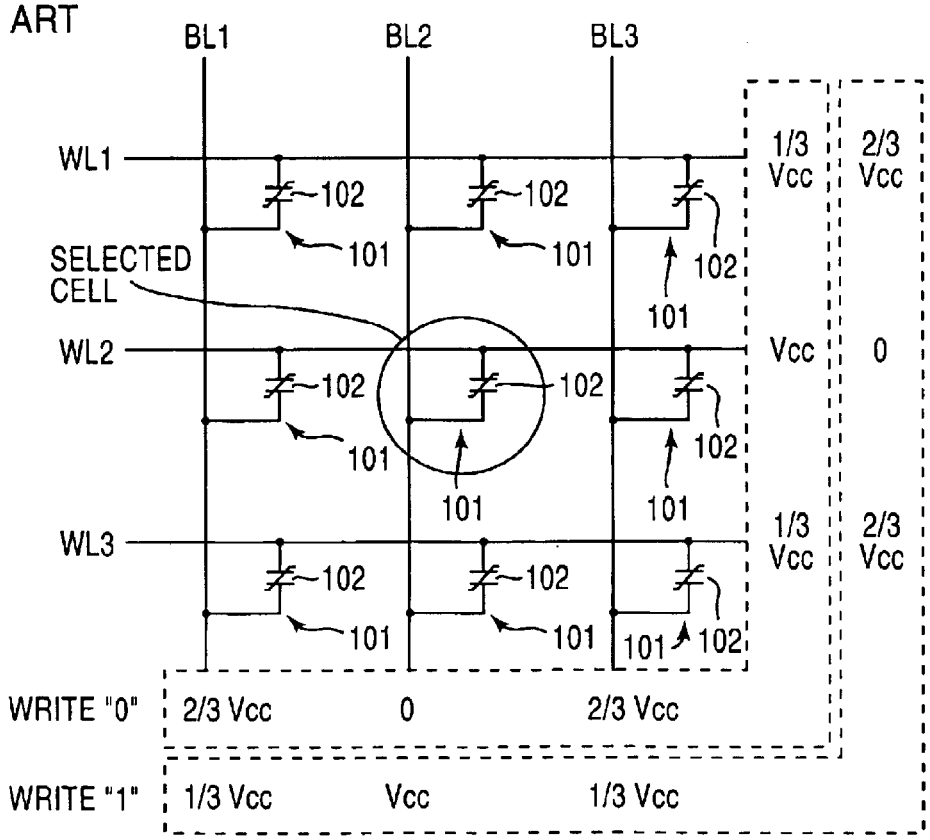
FIG. 6 is a schematic diagram for illustrating the structure of a memory cell array of a conventional cross point ferroelectric memory and voltages applied in writing.

FIG. 5 is a schematic diagram for illustrating the structure of a memory cell array of a ferroelectric memory according to a second embodiment of the present invention and voltages applied in reading. Referring to FIG. 5, the second embodiment of the present invention is applied to a one-transistor one-capacitor (1T1C) ferroelectric memory, dissimilarly to the aforementioned first embodiment. The overall structure, excluding the memory cell array, of the ferroelectric memory according to the second embodiment and the internal structure of a read amplifier are similar to those in the first embodiment.

In the ferroelectric memory according to the second embodiment, each memory cell 21 is constituted of a single ferroelectric capacitor 22 and a single selector transistor 23, as shown in FIG. 5. The ferroelectric capacitor 22 has a first electrode connected to a plate line PL (PL1 or PL2) and a second electrode connected to a first source/drain of the selector transistor 23. A second source/drain of the selector transistor 23 is connected to a bit line BL (BL1 or BL2). The gate of the selector transistor 23 is connected to a word line WL (WL1 or WL2).

In an initial state of reading of the ferroelectric memory according to the second embodiment, the bit lines BL1 and BL2, a selected plate line PL1 and a selected word line WL1 are at 0 V. Thereafter the ferroelectric memory brings the bit lines BL1 and BL2 into floating states (high impedance states) while the selected word line WL1 rises to a power supply voltage Vcc, thereby connecting the ferroelectric capacitors 22 to the bit lines BL1 and BL2 in a first read operation. Then, the plate line PL1 rises to the power supply voltage Vcc, whereby a first read potential appears on the bit lines BL1 and BL2. This potential is preserved in the read amplifier similar in structure to the read amplifier 7 of the ferroelectric memory according to the first embodiment shown in FIG. 2. This read amplifier is also similar in operation to the read amplifier 7 of the ferroelectric memory according to the first embodiment. The ferroelectric memory can read data from a specific selected cell by selecting a bit line for reading the data from among a plurality of selected cells connected to the selected word line WL1 through a column address.

In a second read operation, the ferroelectric memory precharges the bit lines BL1 and BL2 to the power supply voltage Vcc and thereafter brings the same into floating states (high impedance states). Then, the plate line PL1 falls to 0 V, whereby a second read potential appears on the bit lines BL1 and BL2. The ferroelectric memory compares the second read potential with the first bit line potential through the read amplifier similar to the read amplifier 7 of the ferroelectric memory according to the first embodiment by a method similar to that employed in the first embodiment, for defining data.

After the data reading, the ferroelectric memory performs rewriting (restoration) responsive to the read data, thereby completing the reading.

The ferroelectric memory according to the second embodiment can perform data reading with no reference cell for generating a reference potential at an intermediate level between bit line potentials for data "0" and "1" dissimilarly to the prior art by applying bias potentials |Vcc| reversed in polarity to each other with equal absolute values to the ferroelectric capacitors 22 in first and second times of data reading as hereinabove described. Thus, no fluctuation of the reference potential results from dispersion in fabrication of the reference cell or fatigue caused by repetitive read and write operations, whereby the ferroelectric memory can suppress reduction of a read margin resulting from fluctuation of the reference potential. Consequently, the ferroelectric memory can suppress false data reading. According to the second embodiment, further, the ferroelectric memory may be provided with no reference cell and hence the area of the memory cell array can be reduced.

The remaining effects of the second embodiment are similar to those of the first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a ferroelectric memory including ferroelectric capacitors serving as hysteretic capacitance means in each of the aforementioned embodiments, the present invention is not restricted to this but is also applicable to another memory including hysteretic capacitance means.

While the aforementioned first embodiment employs a ⅓Vcc method of applying a voltage ⅓Vcc to non-selected cells, the present invention is not restricted to this but a ½Vcc method may alternatively be employed for applying a voltage ½Vcc to non-selected cells in data reading and data writing. When employing the ⅓Vcc method, however, it is possible to further suppress disturbance causing disappearance of data due to polarization deterioration of non-selected cells as compared with the case of employing the ½Vcc method.

What is claimed is:

1. A memory device comprising:

hysteretic capacitance means; and a read circuit applying a bias voltage to said capacitance means in different directions in a first time and a second time of data reading respectively for defining read data by comparing first read data and second read data with each other.

2. The memory device according to claim 1, wherein said read circuit defines said read data on the basis of a variation of the potential of a bit line corresponding to said first read data and a variation of the potential of a bit line corresponding to said second read data.

3. The memory device according to claim 2, wherein said read circuit includes a first circuit part detecting said variation of the potential of said bit line corresponding to said first read data and a second circuit part detecting said variation of the potential of said bit line corresponding to said second read data.

4. The memory device according to claim 3, wherein said first circuit part includes a first transistor connected to said bit line for entering an ON state in said first time of said data reading and entering an OFF state in said second time of said data reading, and said second circuit part includes a second transistor connected to said bit line for entering an ON state in said second time of said data reading and entering an OFF state in said first time of said data reading.

5. The memory device according to claim 1, wherein said read circuit includes a resistance dividing circuit for generating a reference potential consisting of a first potential.

6. The memory device according to claim 5, wherein said read circuit defines said read data on the basis of the difference between a variation of the potential of a bit line corresponding to said first read data and a variation of the potential of a bit line corresponding to said second read data and said reference potential consisting of said first potential generated by said resistance dividing circuit.

7. The memory device according to claim 6, wherein said read circuit includes a comparator comparing the difference between said variation of the potential of said bit line corresponding to said first read data and said variation of the potential of said bit line corresponding to said second read data respectively with said reference potential generated by said resistance dividing circuit.

8. The memory device according to claim 7, wherein said comparator includes a first input terminal supplied with said reference potential and a second input terminal connected with a node, said resistance dividing circuit also generates a second potential in addition to said reference potential consisting of said first potential, and said second potential is applied to said node connected with said second input terminal of said comparator as an initial potential.

9. The memory device according to claim 8, wherein said read circuit includes a third transistor connected between a portion of said resistance dividing circuit generating said second potential and said node connected with said second input terminal of said comparator for entering an ON state in an initial state and entering an OFF state in said data reading.

10. The memory device according to claim 8, wherein said reference potential is set to an intermediate level between a potential obtained by adding the difference between said variation of the potential of said bit line corresponding to said first read data and said variation of the potential of said bit line corresponding to said second read data with reference to initial data formed by first data to said initial potential of said node and a potential obtained by adding the difference between said variation of the potential of said bit line corresponding to said first read data and said variation of the potential of said bit line corresponding to said second read data with reference to initial data formed by second data to said initial potential of said node.

11. The memory device according to claim 1, wherein first said bias voltage and second said bias voltage applied to said capacitance means in said data reading are voltages, reversed in polarity to each other, having substantially equal absolute values.

12. The memory device according to claim 1, wherein the hysteresis curve of said capacitance means is substantially symmetrical with respect to the origin.

13. The memory device according to claim 1, wherein said hysteretic capacitance means includes a ferroelectric capacitor.

14. The memory device according to claim 13, wherein said ferroelectric capacitor consists of a bit line, a word line and a ferroelectric film arranged between said bit line and said word line, said memory device further comprising memory cells each consisting of said ferroelectric capacitor.

15. The memory device according to claim 14, wherein a voltage n/m times said bias voltage, where m>n, is applied to memory cells other than selected said memory cell in said data reading.

16. The memory device according to claim 13, further comprising memory cells each consisting of a single said ferroelectric capacitor and a single transistor connected to said ferroelectric capacitor.

* * * * *